United States Patent
Liao et al.

(10) Patent No.: US 10,204,730 B2
(45) Date of Patent: Feb. 12, 2019

(54) ELECTRONIC DEVICE AND MANUFACTURING METHOD THEREOF

(71) Applicant: CYNTEC CO., LTD., Hsinchu (TW)

(72) Inventors: Wen-Hsiung Liao, Hsinchu County (TW); Roger Hsieh, Hsinchu County (TW); Hideo Ikuta, Kyoto (JP); Yueh-Lang Chen, Hsinchu (TW)

(73) Assignee: CYNTEC CO., LTD., Hsinchu (TW)

(*) Notice: Subject to any disclaimer, the term of this patent is extended or adjusted under 35 U.S.C. 154(b) by 302 days.

(21) Appl. No.: 15/283,451

(22) Filed: Oct. 3, 2016

(65) Prior Publication Data

US 2017/0025216 A1    Jan. 26, 2017

Related U.S. Application Data

(63) Continuation of application No. 14/507,849, filed on Oct. 7, 2014, now Pat. No. 9,481,037, which is a (Continued)

(30) Foreign Application Priority Data

May 15, 2009    (TW) .............................. 98116158 A

(51) Int. Cl.
*H01F 27/32* (2006.01)
*H01F 5/00* (2006.01)
(Continued)

(52) U.S. Cl.
CPC .............. *H01F 27/255* (2013.01); *B22F 3/12* (2013.01); *B22F 3/16* (2013.01); *B22F 5/00* (2013.01);
(Continued)

(58) Field of Classification Search
CPC .................... H01F 5/00; H01F 27/00–27/36
(Continued)

(56) References Cited

U.S. PATENT DOCUMENTS 5,567,746 A    10/1996   Gay
6,204,744 B1 * 3/2001   Shafer ................... H01F 17/04
                                                       336/200
(Continued)

FOREIGN PATENT DOCUMENTS

EP        2290660       5/2009
JP        2001223106    8/2001
(Continued)

*Primary Examiner* — Tuyen Nguyen
(74) *Attorney, Agent, or Firm* — Min-Lee Teng; Litron Patent & Trademark Office

(57) ABSTRACT

A method for manufacturing an electronic device, the method comprising: providing a conducting wire; forming a mixture with the conducting wire buried therein, wherein the mixture comprises: a first magnetic powder and a second magnetic powder, wherein the mean particle diameter of the first magnetic powder is larger than the mean particle diameter of the second magnetic powder, and the Vicker's Hardness of the first magnetic powder is greater than the Vicker's Hardness of the second magnetic powder by a first hardness difference; and performing a molding process on the conducting wire and the mixture, wherein by means of the first hardness difference of the first magnetic powder and the second magnetic powder, the mixture and the conducting wire buried therein are combined to form an integral magnetic body at a temperature lower than the melting point of the conducting wire.

20 Claims, 13 Drawing Sheets

Related U.S. Application Data continuation of application No. 14/294,164, filed on Jun. 3, 2014, now Pat. No. 9,381,573, which is a continuation of application No. 13/561,266, filed on Jul. 30, 2012, now Pat. No. 8,771,436, which is a continuation of application No. 12/703,495, filed on Feb. 10, 2010, now Pat. No. 8,518,190.

(51) Int. Cl.

| | | |
|---|---|---|
| *H01F 27/255* | (2006.01) | |
| *H01F 27/24* | (2006.01) | |
| *H01F 17/04* | (2006.01) | |
| *H01F 41/02* | (2006.01) | |
| *H01F 27/28* | (2006.01) | |
| *H05K 1/18* | (2006.01) | |
| *B22F 3/12* | (2006.01) | |
| *B22F 5/00* | (2006.01) | |
| *B22F 7/08* | (2006.01) | |
| *H01F 1/22* | (2006.01) | |
| *B22F 3/16* | (2006.01) | |
| *H01F 27/29* | (2006.01) | |

(52) U.S. Cl.
CPC ............... *B22F 7/08* (2013.01); *H01F 1/22* (2013.01); *H01F 5/00* (2013.01); *H01F 17/04* (2013.01); *H01F 27/24* (2013.01); *H01F 27/2823* (2013.01); *H01F 27/32* (2013.01); *H01F 41/0246* (2013.01); *H05K 1/18* (2013.01); *H01F 27/292* (2013.01); *H01F 2017/048* (2013.01)

(58) Field of Classification Search
USPC ............... 336/65, 83, 90, 96, 200, 206–208, 336/232–233
See application file for complete search history.

(56) References Cited

U.S. PATENT DOCUMENTS

| | | | |
|---|---|---|---|
| 6,392,525 B1* | 5/2002 | Kato | H01F 3/08 336/200 |
| 7,170,378 B2 | 1/2007 | Fujiwara et al. | |
| 7,744,702 B2 | 6/2010 | Tomita et al. | |
| 7,767,035 B2 | 8/2010 | Sato et al. | |
| 2003/0048167 A1* | 3/2003 | Inoue | H01F 17/0013 336/200 |
| 2003/0150523 A1 | 8/2003 | Fujiwara et al. | |
| 2003/0160677 A1 | 8/2003 | Fujiwara et al. | |
| 2004/0021542 A1 | 2/2004 | Fujiwara et al. | |
| 2004/0113744 A1 | 6/2004 | Watanabe et al. | |
| 2005/0007232 A1* | 1/2005 | Ono | H01F 1/1475 336/213 |
| 2005/0254989 A1 | 11/2005 | Fujiwara et al. | |
| 2006/0170524 A1 | 8/2006 | Fujiwara | |
| 2006/0279395 A1* | 12/2006 | Lee | H01F 1/26 336/221 |
| 2007/0175545 A1 | 8/2007 | Urata et al. | |
| 2009/0004475 A1 | 1/2009 | Sadaka | |

FOREIGN PATENT DOCUMENTS

| | | |
|---|---|---|
| JP | 2002075719 | 3/2002 |
| JP | 2002164208 | 6/2002 |
| JP | 2002217014 | 8/2002 |
| JP | 2003188009 | 7/2003 |
| JP | 2003217919 | 7/2003 |
| JP | 2003249410 | 9/2003 |
| JP | 2004103778 | 4/2004 |
| JP | 2004103779 | 4/2004 |
| JP | 2004363466 | 10/2004 |
| JP | 2005294458 | 10/2005 |
| JP | 2006287004 | 10/2006 |
| JP | 2006294775 | 10/2006 |
| JP | 2007134381 | 5/2007 |
| JP | 2007134591 | 5/2007 |
| JP | 04106966 | 6/2008 |

* cited by examiner

ELECTRONIC DEVICE AND MANUFACTURING METHOD THEREOF

CROSS-REFERENCE TO RELATED APPLICATION

This application is a continuation of U.S. patent application Ser. No. 14/507,849 filed on Oct. 7, 2014, which is a continuation of U.S. patent application Ser. No. 14/294,164 filed on Jun. 3, 2014, which is a continuation of U.S. patent application Ser. No. 13/561,266 filed on Jul. 30, 2012, which is a continuation of U.S. patent application Ser. No. 12/703,495 filed on Feb. 10, 2010, which claims priority of Taiwan application Ser. No. 98116158 filed on May 15, 2009. The entirety of the above-mentioned patent applications are hereby incorporated by reference herein and made a part of specification.

BACKGROUND OF THE INVENTION

Field of the Invention

The present invention relates to a magnetic element and a method for manufacturing the same. More particularly, the present invention relates to an electronic device and a method for manufacturing the same.

Description of Related Art

An electronic device functions as stabilizing current in a circuit and filtering noises. The function of an electronic device is similar with that of a capacitor—they both adjust the stability of current by storing and discharging the electric power in the circuit. While a capacitor stores the electric power in a form of an electric field (electric charge), an electronic device does the same in a form of a magnetic field. There are energy losses in wires and magnetic core (usually called "core loss") when it comes to the application of an electronic device. In related art, a wire of an electronic device is buried inside a magnetic body. The method of manufacturing this kind of electronic device is to firstly place the wire in a mold, to fill in the mold with iron powder which includes an adhesive and is in the similar size of the particle diameter to cover the wire, and to compress the iron powder into the magnetic body by means of a pressure molding. Then, the adhesive is heated up to be cured. The permeability of the electronic device with its magnetic body made of iron powder will slump in a high frequency above 10 KHz. Therefore, the conventional electronic device cannot be applied in the practice of high frequencies.

SUMMARY OF THE INVENTION

The present invention provides an electronic device. A magnetic body thereof includes a plurality of kinds of magnetic powder with different hardness and different mean particle diameters to improve the permeability of the electronic device.

The present invention provides a method of manufacturing an electronic device, and the method adopts a plurality of kinds of magnetic powder with different hardness and different mean particle diameters to manufacture a magnetic body so as to improve the permeability of the electronic device. The present invention relates to an electronic device including a magnetic body and a wire. The magnetic body includes a first magnetic powder and a second magnetic powder, wherein the Vicker's Hardness of the first magnetic powder is greater than the Vicker's Hardness of the second magnetic powder, the mean particle diameter of the first magnetic powder is larger than the mean particle diameter of the second magnetic powder, and the first magnetic powder mixes with the second magnetic powder. According to an embodiment of the present invention, the Vicker's Hardness of the first magnetic powder is greater than or equal to 150 and the Vicker's Hardness of the second magnetic powder is smaller than or equal to 100. According to an embodiment of the present invention, the Vicker's Hardness of the first magnetic powder is greater than or equal to 250 and the Vicker's Hardness of the second magnetic powder is smaller than or equal to 80. According to an embodiment of the present invention, the mean particle diameter of the first magnetic powder is substantially 10 µm to 40 µm. According to an embodiment of the present invention, the mean particle diameter of the second magnetic powder is smaller than or equal to 10 µm. According to an embodiment of the present invention, the mean particle diameter of the second magnetic powder is smaller than or equal to 4 µm.

According to an embodiment of the present invention, the ratio of the mean particle diameter of the first magnetic powder to the mean particle diameter of the second magnetic powder is larger than 2. According to an embodiment of the present invention, the ratio of the mean particle diameter of the first magnetic powder to the mean particle diameter of the second magnetic powder is 2.5-10. According to an embodiment of the present invention, the material of the first magnetic powder includes metal alloy. According to an embodiment of the present invention, the material of the first magnetic powder includes Fe—Cr—Si alloy, Fe—Ni alloy, amorphous alloy, Fe—Si alloy, or Fe—Al—Si alloy. According to an embodiment of the present invention, the material of the second magnetic powder includes iron or ferroalloy. According to an embodiment of the present invention, the material of the first magnetic powder includes amorphous alloy, and the material of the second magnetic powder includes iron.

According to an embodiment of the present invention, the ratio of the weight of the first magnetic powder to the weight of the second magnetic powder is 0.25-4.

According to an embodiment of the present invention, when the material of the first magnetic powder includes amorphous alloy and the material of the second magnetic powder includes iron, the ratio of the weight of the first magnetic powder to the weight of the second magnetic powder is 0.67-1.5. According to an embodiment of the present invention, when the material of the first magnetic powder includes Fe—Cr—Si alloy and the material of the second magnetic powder includes iron, the ratio of the weight of the first magnetic powder to the weight of the second magnetic powder is 1.5-4. According to an embodiment of the present invention, a wire includes a buried part buried in the magnetic body or a winding part winding on the magnetic body.

According to an embodiment of the present invention, the magnetic body is manufactured by a molding process, and the molding pressure of the molding process is $6t/cm^2$-$11t/cm^2$. The present invention provides an electronic device, comprising: a magnetic body, comprising: a first magnetic powder; and a second magnetic powder, wherein the Vicker's Hardness of the first magnetic powder is greater than the Vicker's Hardness of the second magnetic powder, the mean particle diameter of the first magnetic powder is larger than the mean particle diameter of the second magnetic powder, and the first magnetic powder mixes with the second magnetic powder; an adhesive, joining the first magnetic powder and the second magnetic powder; and a wire.

According to an embodiment of the present invention, the content of the adhesive is 2 wt %-3 wt % of the total weight of the magnetic body.

According to an embodiment of the present invention, a material of the adhesive is thermoset resin.

Based on the above, the magnetic body is made of magnetic powder of different mean particle diameters in the present invention. Therefore, during the molding process, magnetic powder of small mean particle diameter is filled in the space among magnetic powder of large mean particle diameter such that the density of compression is increased so as to improve the permeability of the electronic device. Moreover, the magnetic body is made of magnetic powder of different hardness in the present invention. Therefore, the strains of magnetic powder caused during the molding process are largely reduced and the core loss of the electronic device of the present invention is further decreased. In addition, the present invention does not require performing a high temperature heat treatment to the electronic device for releasing the strains of the magnetic powder so that the present invention can avoid a problem of oxidation of the wire for being unable to stand the high temperature. In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
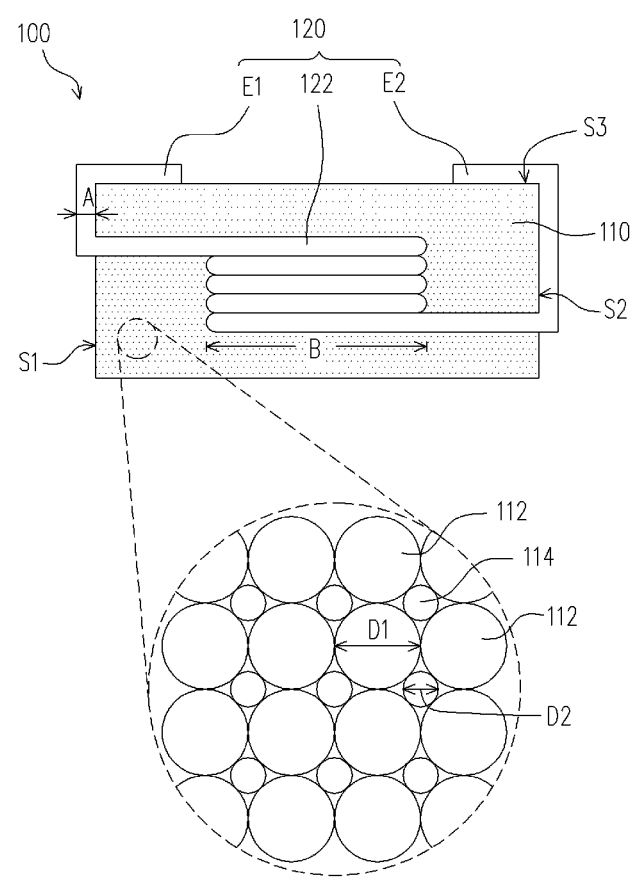
FIG. 1 is a cross-sectional view illustrating an electronic device according to an embodiment of the present invention.
Figure 2A:
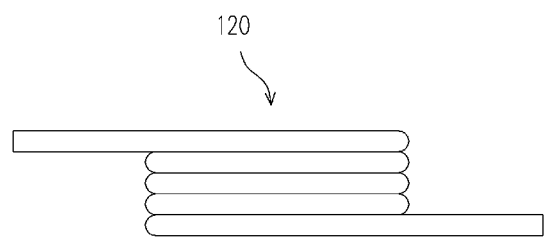
FIGS. 2A-2D are cross-sectional views of a manufacturing process of the electronic device in FIG. 1.
Figure 2B:
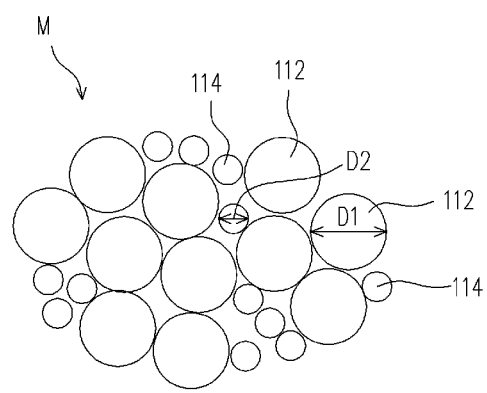
Figure 2C:
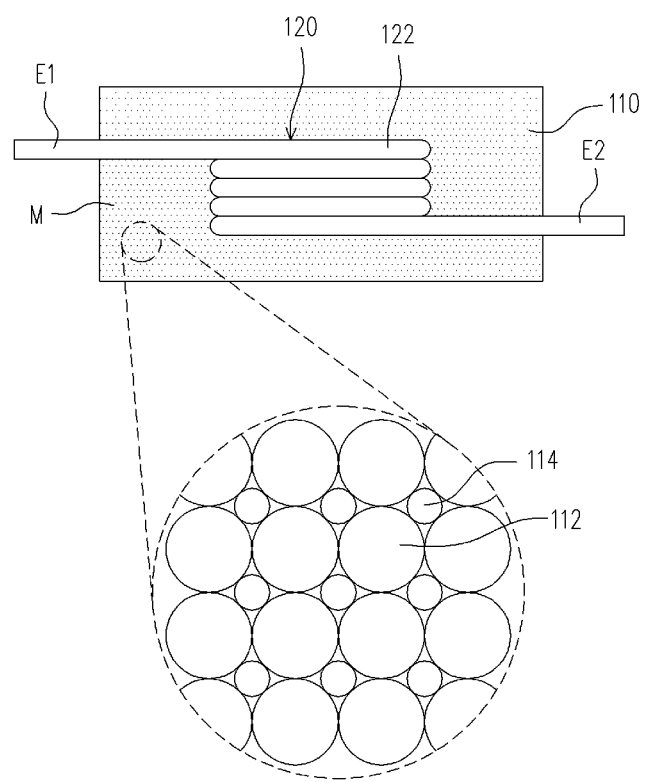
Figure 2D:
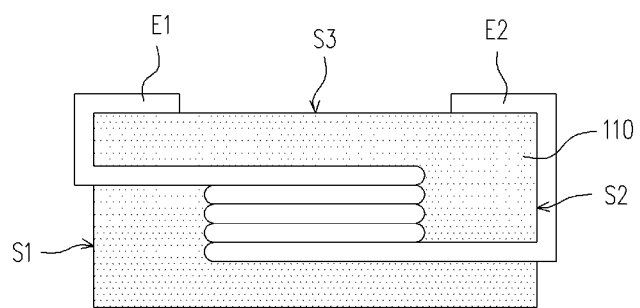

FIG. 1 is a cross-sectional view illustrating an electronic device according to an embodiment of the present invention. Referring to FIG. 1, an electronic device 100 of the embodiment includes a magnetic body 110 and a wire 120. The magnetic body 100 includes a first magnetic powder 112 and a second magnetic powder 114, and the first magnetic powder 112 is mixed with the second magnetic powder 114, wherein the magnetic body 100 is manufactured by a molding process. The Vicker's Hardness of the first magnetic powder 112 is greater than the Vicker's Hardness of the second magnetic powder 114. The Vicker's Hardness of the first magnetic powder 112 is, for example, larger than or equal to 150. Preferably, the Vicker's Hardness of the first magnetic powder 112 is larger than or equal to 250. The Vicker's Hardness of the second magnetic powder 114 is, for example, smaller than or equal to 100. Preferably, the Vicker's Hardness of the second magnetic powder 114 is smaller than or equal to 80.

The mean particle diameter D1 of the first magnetic powder 112 is greater than the mean particle diameter D2 of the second magnetic powder 114. The mean particle diameter D2 of the second magnetic powder 114 is smaller than or equal to 10 μm.

The mean particle diameter D1 of the first magnetic powder 112 can substantially be 10 μm-40 μm, and the mean particle diameter D2 of the second magnetic powder 114 can substantially be smaller than or equal to 4 μm. The ratio of the mean particle diameter D1 of the first magnetic powder 112 to the mean particle diameter D2 of the second magnetic powder 114 is, for example, greater than 2. Preferably, the ratio of the mean particle diameter D1 to the mean particle diameter D2 is 2.5-10.

The material of the first magnetic powder 112 is, for example, metal alloy, and the metal alloy is such as Fe—Cr—Si alloy, Fe—Ni alloy, amorphous alloy, Fe—Si alloy, or Fe—Al—Si alloy. The material of the second magnetic powder 114 is, for example, iron or ferroalloy. Preferably, the material of the first magnetic powder 112 is, for example, amorphous alloy, and the material of the second magnetic powder 114 is such as iron. The magnetic body 110 further includes an adhesive (not shown), and the adhesive is mixed with the first magnetic powder 112 and the second magnetic powder 114. The first magnetic powder 112 and the second magnetic powder 114 are mutually joined by the adhesive. The material of the adhesive can be thermoset resin, e.g. epoxy resin. The content of the adhesive is 2 wt %-3 wt % of the total weight of the magnetic body 110 and the contents of the first magnetic powder 112 and the second magnetic powder 114 is 98 wt %-97 wt % of the total weight of the magnetic body 110. The weight proportion of the first magnetic powder 112 is 20 wt %-80 wt % and the weight proportion of the second magnetic powder 114 is 80 wt %-20 wt %. That is, the ratio of the weight of the first magnetic powder 112 to the weight of the second magnetic powder 114 can be 0.25-4.

The wire 120 has a buried portion 122 buried in the magnetic body 110 and end portions E1 and E2 extending from two ends of the buried portion 122 and out of the magnetic body 110, wherein the end portions E1 and E2 are adopted to an electric connection with other electric elements (not shown). More specifically, the magnetic body 110 is a rectangular body and end portions E1 and E2 can be extended to a side S3 of the magnetic body 110 along two opposite side walls S1 and S2 of the magnetic body 110. As a result, the electronic device 100 can be electrically connected to other electric elements by surface mounting. The wire 120 is such as a copper wire and the buried portion 122 is, for example, a wound coil.

It should be noted that, in the present embodiment, the mean particle diameter and the hardness of the first magnetic powder 112 are both greater than the mean particle diameter and the hardness of the second magnetic powder 114. Therefore, during a molding process, the second magnetic powder 114 is easily filled in spaces among the first magnetic powder 112, and strains caused by the mutual compression of the second magnetic powder 114 and the first magnetic powder 112 can be reduced. Therefore, the density of compression is increased and the permeability of the electronic device formed can be improved. In addition, it can be avoid using greater molding pressure and high temperature heat treatment so as to improve the density of compression and the permeability.

Moreover, the magnetic body 110 includes the first magnetic powder 112, which has less core loss than iron powder does. Therefore, compared with electronic devices in the related art, of which iron powder is used as a magnetic body, the electronic device according to the present embodiment provides less core loss and the efficiency of the electronic device is increased. In addition, the cost of material of the magnetic body 110 including the first magnetic powder 112 and the second magnetic powder 114 is lower than that of a magnetic body manufactured with metal alloy.

FIGS. 2A-2D are cross-sectional views of a manufacturing process of the electronic device in FIG. 1. A detailed manufacturing process of the electronic device 100 in FIG. 1 is described in FIGS. 2A-2D. First, referring to FIG. 2A, a wire 120 is provided. Next, referring to FIG. 2B, a mixture M is provided, which includes a first magnetic powder 112, a second magnetic powder 114 and an adhesive (not shown). Then, referring to FIG. 2C, a buried portion 122 of the wire 120 is disposed inside a mold cavity (not shown), two end portions E1 and E2 of the wire 120 are extended outward the mold cavity, and the mixture M is filled in the mold cavity. After that, a molding process is performed on the mixture M to form a magnetic body 110 which covers the buried portion 122. In the molding process, for example, a molding pressure is applied to the mixture M so as to compress the first magnetic powder 112, the second magnetic powder 114 and the adhesive. According to the present embodiment, the molding process performed on the mixture M is a pressure molding process and the pressure applied to the mixture M is such as $6t/cm^2$-$10t/cm^2$. In other embodiments, the molding process can also be a cast molding process, an injection molding process, or other suitable molding process. Next, the adhesive is solidified, for example, by a heating method, and the temperature of the heating is equal to or slightly higher than the solidified temperature of the adhesive, such as lower than 300° C. It should be noted that, the heating temperature adopted in the present embodiment is merely adequate for solidifying the adhesive. Last, referring to FIG. 2D, two end portions E1 and E2 are bended so that two end portions E1 and E2 are extended to a side S3 of the magnetic body 110 respectively along two opposite side walls S1 and S2 of the magnetic body 110.

Figure 3:
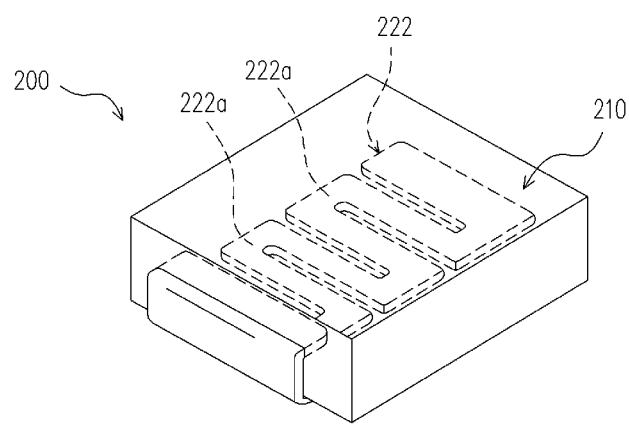
FIG. 3 is a schematic view illustrating an electronic device according to another embodiment of the present invention.

FIG. 3 is a schematic view illustrating an electronic device according to another embodiment of the present invention. Referring to FIG. 3, the material of a magnetic body 210 is the same with that of the magnetic body 110 in FIG. 1 and needs not to be described again. The differences between an electronic device 200 of the present embodiment and the electronic device 100 of FIG. 1 lie in that a buried portion 222 can include a plurality of bent structures 222a and these bent structures 222a are substantially disposed on the same plane.

Figure 4:
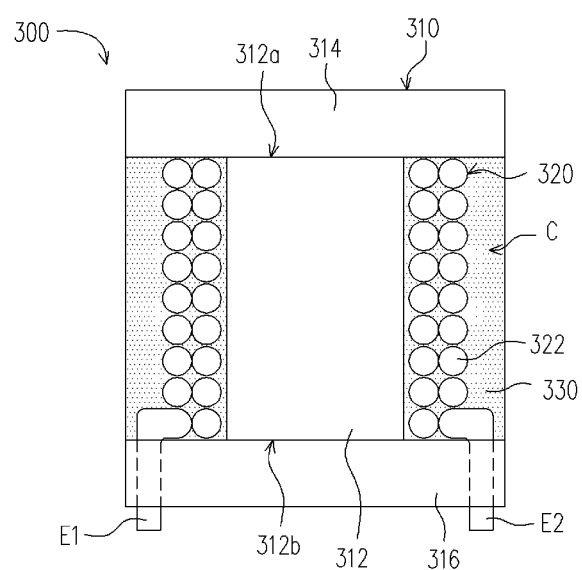
FIG. 4 is a cross-sectional view illustrating an electronic device according to yet another embodiment of the present invention.

FIG. 4 is a cross-sectional view illustrating an electronic device according to yet another embodiment of the present invention. Referring to FIG. 4, the material of a magnetic body 310 is the same with that of the magnetic body 110 in FIG. 1 and needs not to be described again. The differences between an electronic device 300 of the present embodiment and the electronic device 100 of FIG. 1 lie in that a magnetic body 310 of the present embodiment is a drum-like structure and a wire 320 is disposed outside the magnetic body 310. The magnetic body 310 of the present embodiment includes a center column 312, a first board-shaped body 314 and a second board-shaped body 316, wherein two ends 312a and 312b of the center column 312 connect the first board-shaped body 314 and the second board-shaped body 316 respectively, and the wire 320 winds around the center column 312. More specifically, a winding space C is formed among the first board-shaped body 314, the second board-shaped body 316 and the center column 312. The wire 320 includes two end portions E1 and E2 and a winding portion 322 connected between the two end portions E1 and E2. The winding portion 322 is disposed inside the winding space C and winds around the center column 312 while the two end portions E1 and E2 extend from inside the winding space C to outside the winding space C and electrically connect other electric elements (not shown). Besides, the winding space C can be filled in with a magnetic material 330 or a resin material (not shown) so that the winding space C is filled in and the winding portion 322 of the wire 320 is covered.

Figure 5A:
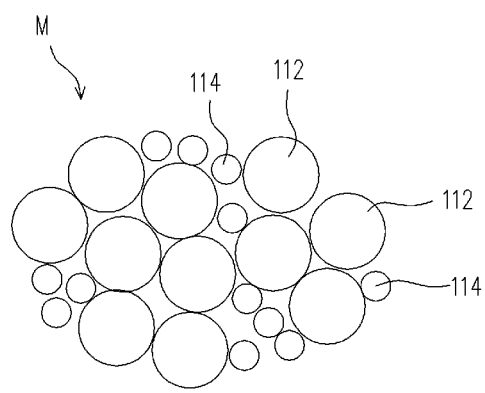
FIGS. 5A-5C are cross-sectional views of a manufacturing process of the electronic device in FIG. 4.
Figure 5B:
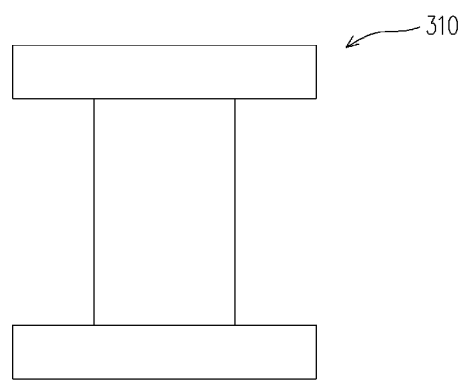
Figure 5C:
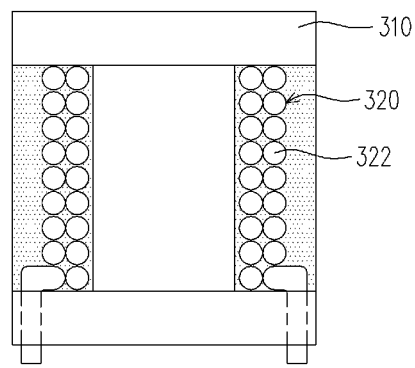

FIGS. 5A-5C are cross-sectional views of a manufacturing process of the electronic device in FIG. 4. A detailed manufacturing process of the electronic device 300 in FIG. 4 is described in FIGS. 5A-5C. First, referring to FIG. 5A, a mixture M is provided. The material of the mixture M here is the same with that of the mixture M in FIG. 2B. Next, referring to FIG. 5B, a molding process is performed on the mixture M to form the magnetic body 310. In the present embodiment, the molding process includes a pressure molding process, a cast molding process, or an injection molding process. During the pressure molding process, the pressure applied to the mixture M is such as $6t/cm^2$-$11t/cm^2$. Then, the adhesive (not shown) is solidified by a heating method, and the temperature of the heating is equal to or slightly higher than the solidified temperature of the adhesive, such as lower than 300° C. It should be noted that, the heating temperature adopted in the present embodiment is merely adequate for solidifying the adhesive. Last, referring to FIG. 5C, the winding portion 322 of the wire 320 is wound on the magnetic body 310.

Figure 6:
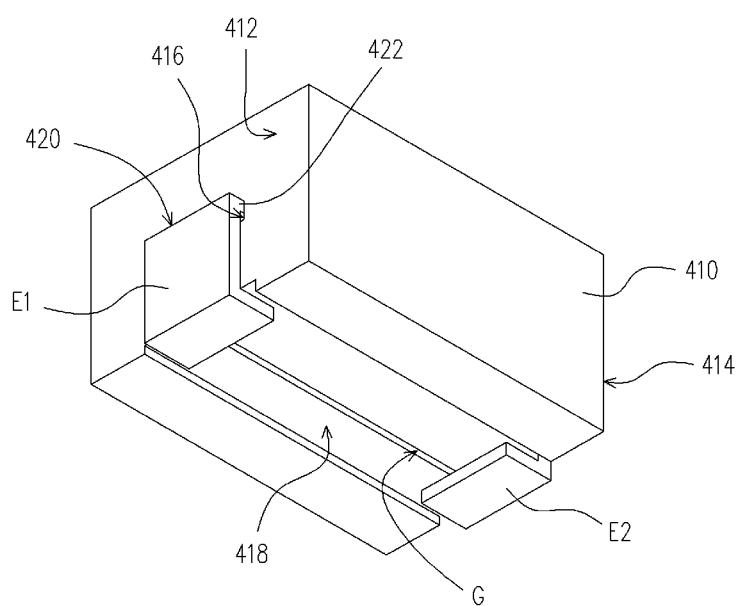
FIG. 6 is a schematic view illustrating an electronic device according to a further embodiment of the present invention.

FIG. 6 is a schematic view of an electronic device according to another embodiment of the present invention. Referring to FIG. 6, the material of a magnetic body 410 is the same with that of the magnetic body 110 in FIG. 1 and needs not to be described again. In the present embodiment, the magnetic body 410 includes a first surface 412, a second surface 414 opposite to the first surface 412, and a through hole 416 going through the first surface 412 and the second surface 414. A wire 420 is such as a conductive piece and includes two end portions E1 and E2 and a winding portion 422 connected between the two end portions E1 and E2. The winding portion 422 goes through the through hole 416 and the two end portions E1 and E2 extend to a third side 418 of the magnetic body 410 along the first surface 412 and the second surface 414 of the magnetic body 410. The third surface 418 connects the first surface 412 and the second surface 414. The magnetic body 410 can selectively include a slice G going through the third surface 418 and leading to the through hole 416.

The results of electric tests on electronic devices 100 and 300 including different ratios of a first magnetic powder and a second magnetic powder are provided below.

<Experiment 1>

The structure of an electronic device in Experiment 1 is the same with the structure of the electronic device 100 in FIG. 1. The thread diameter A of the wire 120 is 0.32 mm, the diameter B of the coil is 2.4 mm, the number of turns of the coil is 11.5, and the molding pressure for the magnetic body 110 is 11t/cm². The major ingredient, mean particle diameter, and hardness of a first magnetic powder and a second magnetic powder in Experiment 1 are all listed in Table 1.

TABLE 1

|  | Major ingredient | Mean particle diameter (D50) | Hardness (Hv) |
|---|---|---|---|
| First magnetic powder | Fe—Cr—Si | 10 μm | 250 |
| Second magnetic powder | iron | 4 μm | 30-80 |

Figure 7:
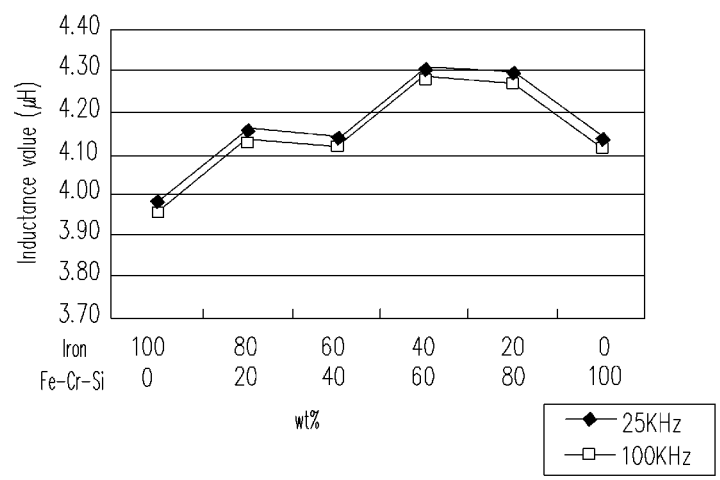
FIG. 7 illustrates variation condition of inductance values of an electronic device in two frequencies when the ratio of a first magnetic powder to a second magnetic powder in a magnetic body changes.

Based on Table 1, the ratio of D1 to D2 is 2.5. FIG. 7 illustrates variation condition of inductance values of the electronic device in two frequencies (25 KHz and 100 KHz) when the ratio of the first magnetic powder to the second magnetic powder in the magnetic body changes. Referring to FIG. 7, the inductance values of an electronic device with the proportion of 20 wt %-80 wt % of the first magnetic powder are all greater than the inductance values of an electronic device with the proportion of 100 wt % of the first magnetic powder or the second magnetic powder. In preferred conditions, the proportion of the first magnetic powder is 60 wt % and the proportion of the second magnetic powder is 40 wt %. That is, the ratio of the weight of the first magnetic powder to the weight of the second magnetic powder is 1.5. Or, the proportion of the first magnetic powder is 60 wt %-80 wt % and the proportion of the second magnetic powder is 40 wt %-20 wt %, i.e. the ratio of the weight of the first magnetic powder to the weight of the second magnetic powder is 1.5-4.

<Experiment 2>

The structure of an electronic device in Experiment 2 is the same with the structure of the electronic device 100 in FIG. 1. The thread diameter A of the wire 120 is 0.32 mm, the diameter B of the coil is 2.4 mm, the number of turns of the coil is 11.5, and the molding pressure for the magnetic body 110 is 11t/cm². The major ingredient, mean particle diameter, and hardness of a first magnetic powder and a second magnetic powder in Experiment 2 are all listed in Table 2.

TABLE 2

|  | Major ingredient | Mean particle diameter (D50) | Hardness (Hv) |
|---|---|---|---|
| First magnetic powder | Amorphous alloy | 40 μm | 900~1,000 |
| Second magnetic powder | iron | 4 μm | 30~80 |
| Second magnetic powder | Fe—Cr—Si | 10 μm | 250 |

Figure 8:
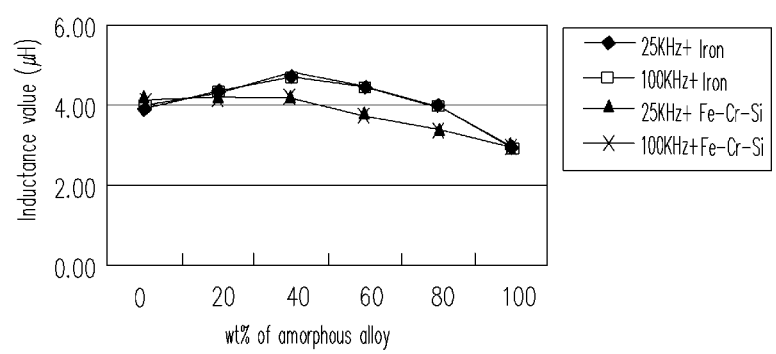
FIG. 8 illustrates variation condition of inductance values of an electronic device in two frequencies when the ratio of a first magnetic powder to a second magnetic powder in a magnetic body changes.

FIG. 8 illustrates variation condition of inductance values of the electronic device in two frequencies when the ratio of the first magnetic powder to the second magnetic powder in the magnetic body changes. Referring to FIG. 8, the inductance values of the electronic device with the proportion of 20 wt %-80 wt % of the first magnetic powder are all greater than the inductance values of the electronic device with the proportion of 100 wt % of the first magnetic powder or the second magnetic powder when the material of the second magnetic powder is iron and the ratio of D1 to D2 is 10. In preferred conditions, the proportion of the first magnetic powder is 40 wt % and the proportion of the second magnetic powder is 60 wt %. That is, the ratio of the weight of the first magnetic powder to the weight of the second magnetic powder is 0.67. Or, the proportion of the first magnetic powder is 40 wt %-60 wt % and the proportion of the second magnetic powder is 60 wt %-40 wt %, i.e. the ratio of the weight of the first magnetic powder to the weight of the second magnetic powder is 0.67-1.5.

The inductance values of the electronic device with the proportion of 20 wt %-80 wt % of the first magnetic powder are greater than the inductance values of the electronic device with the proportion of 100 wt % of the first magnetic powder and the inductance values of the electronic device with the proportion of 20 wt %-40 wt % of the first magnetic powder are slightly higher than the inductance values of the electronic device with the proportion of 100 wt % of the second magnetic powder when the material of the second magnetic powder is Fe—Cr—Si alloy and the ratio of D1 to D2 is 4. Therefore, in preferred conditions, the proportion of the first magnetic powder is 20 wt %-40 wt % and the proportion of the second magnetic powder is 80 wt %-60 wt %. That is, the ratio of the weight of the first magnetic powder to the weight of the second magnetic powder is 0.25-0.67.

Based on the above, it can be known that the smaller the mean particle diameter of the second magnetic powder is, the better effects of the inductance value of the electronic device will be by means of the second magnetic powder of different mean particle diameters and the same first magnetic powder.

Figure 9:
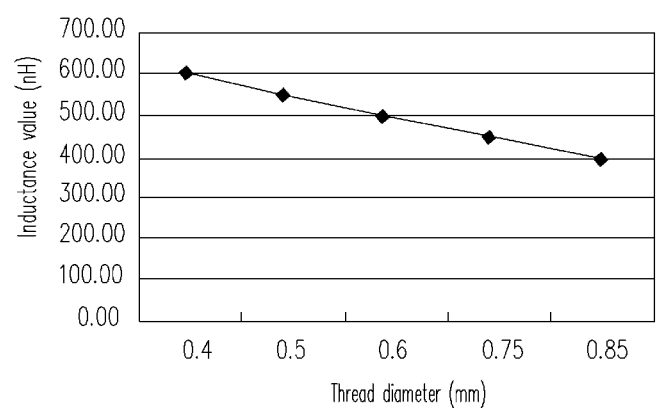
FIG. 9 is a graph showing the changes of inductance values of an electronic device while wires of different thread diameters are adopted.

The following experiment is conducted with a magnetic body including 40 μm of amorphous alloy of the proportion of 40 wt % and 4 μm of iron powder of the proportion of 60 wt %. The variation condition of core loss is listed in Table 3. The variation condition of efficiency is listed in Table 4. FIG. 9 is a graph showing the changes of inductance values of the electronic device while wires of different thread diameters are adopted. The frequency of the experiment in Table 3 is 300 KHz, and the intensity of the magnetic induction is 30 mT. The applied current in Table 4 is 2 amperes.

TABLE 3

| Material of magnetic body | Molding pressure (t/cm$_2$) | Core loss (mW) |
|---|---|---|
| Iron 100 wt % | 6 | 614.73 |
| Amorphous alloy 100 wt % | 6 | 1010.4 |
| Amorphous alloy 100 wt %, performed with high temperature heat treatment after molding process | 6 | 445.2 |
| Amorphous alloy 40 wt % + Iron 60 wt % | 6 | 424.5 |
|  | 11 | 414 |

TABLE 4

|  | Molding pressure 11(t/cm$_2$) | Molding pressure 8.5(t/cm$_2$) |
|---|---|---|
| Efficiency in frequency of 25 KHz (%) | 76.59 | 77.28 |
| Efficiency in frequency of 300 KHz (%) | 90.18 | 90.09 |

Based on Table 3, 40 μm of amorphous alloy is adopted as the first magnetic powder and 4 μm of iron powder is adopted as the second magnetic powder in the present embodiment. The proportion of the first magnetic powder is 40 wt % and the proportion of the second magnetic powder is 60 wt %. Compared with the core loss resulted when the proportion of iron powder is 100 wt %, the proportion of amorphous alloy is 100 wt %, and the proportion of amorphous alloy (performed with high temperature heat treatment after molding process) is 100 wt %, the core loss resulted in the present embodiment is less. And the greater the molding pressure is, the less the core loss is. As a result, it can be shown that, according to the present embodiment, by adopting first magnetic powder and second magnetic powder of different mean particle diameter and hardness, less core loss can be obtained without the performance of high temperature heat treatment. Therefore, a step of high temperature heat treatment is omitted and a process is simplified. In addition, the material cost of the magnetic body 110 including the first magnetic powder 112 and the second magnetic powder 114 is lower than that of the magnetic body including the proportion of 100 wt % of the first magnetic powder.

Based on Table 4, in the frequency of 25 KHz, the efficiency of the electronic device of the present embodiment can reach above 76%, and in the frequency of 300 KHz, the efficiency of the electronic device of the present embodiment can reach above 90%. It is clear that the efficiency performance of the electronic device of the present embodiment is excellent. It should be noted that, the efficiency of the electronic device of the molding pressure of 8.5t/cm$^2$ is greater than that of 11t/cm$^2$.

Based on FIG. 9, under the prerequisite of the same coil diameter B and the same number of turns, the smaller the thread diameter of the wire is, the higher the inductance value of the electronic device is. Therefore, the inductance value of the electronic device can be adjusted by the changes of the thread diameter of the wire.

<Experiment 3>

The structure of an electronic device in Experiment 3 is the same with the structure of the electronic device 100 in FIG. 1. The thread diameter A of the wire 120 is 0.32 mm, the diameter B of the coil is 2.4 mm, the number of turns of the coil is 13.5, and the molding pressure for the magnetic body 110 is 11t/cm$^2$. The major ingredient, mean particle diameter, and hardness of a first magnetic powder and a second magnetic powder in Experiment 3 are all listed in Table 5.

TABLE 5

|  | Major ingredient | Mean particle diameter (D50) | Hardness (Hv) |
|---|---|---|---|
| First magnetic powder | Amorphous alloy | 20 μm | 900~1,000 |
| Second magnetic powder | iron | 4 μm | 30~80 |

Figure 10A:
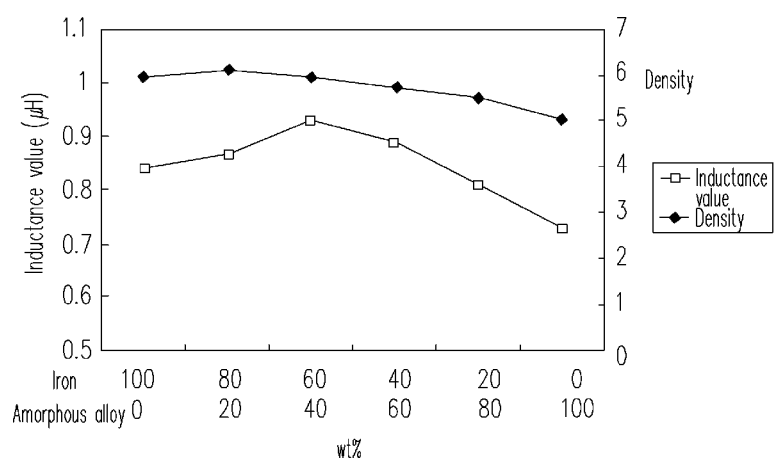
FIG. 10A illustrates variation condition of density of a magnetic body and inductance values of an electronic device when the ratio of a first magnetic powder to a second magnetic powder in the magnetic body changes.
Figure 10B:
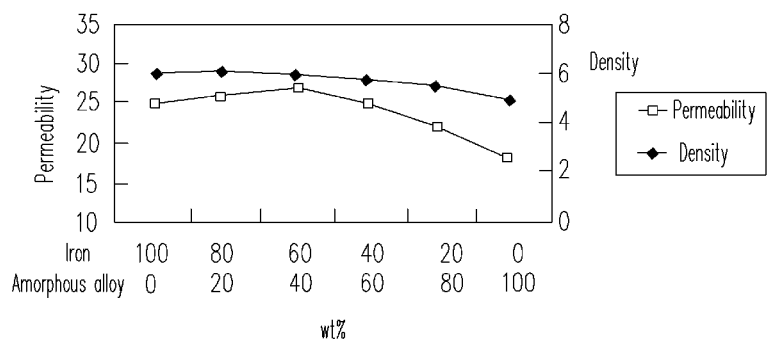
FIG. 10B illustrates variation condition of density of the magnetic body and permeability of an electronic device when the ratio of the first magnetic powder to the second magnetic powder in the magnetic body changes.

Based on Table 5, the ratio of D1 to D2 is 5. FIG. 10A illustrates variation condition of density of a magnetic body and inductance values of an electronic device when the ratio of a first magnetic powder to a second magnetic powder in the magnetic body changes. FIG. 10B illustrates variation condition of density of the magnetic body and permeability of an electronic device when the ratio of the first magnetic powder to the second magnetic powder in the magnetic body changes.

Referring to FIGS. 10A and 10B, the inductance values, the density of the magnetic body, and the permeability of the electronic device with the proportion of 20 wt %-60 wt % of the first magnetic powder are all greater than the inductance values, the density of the magnetic body, and the permeability of the electronic device with the proportion of 100 wt % of the first magnetic powder or the second magnetic powder. Preferably, the proportion of the first magnetic powder is 40 wt % and the proportion of the second magnetic powder is 60 wt %. That is, the ratio of the weight of the first magnetic powder to the weight of the second magnetic powder is 0.67. Or, the proportion of the first magnetic powder is 40 wt %-60 wt % and the proportion of the second magnetic powder is 60 wt %-40 wt %, i.e. the ratio of the weight of the first magnetic powder to the weight of the second magnetic powder is 0.67-1.5.

Table 6 lists the efficiency performance of the electronic device of the present embodiment under the same current (2 amperes), same molding pressure (11t/cm$^2$), and two frequencies.

TABLE 6

|  | Amorphous alloy 20% + iron powder 80% | Amorphous alloy 40% + iron powder 60% |
|---|---|---|
| Efficiency in frequency of 25 KHz (%) | 75.44 | 75.57 |
| Efficiency in frequency of 300 KHz (%) | 90.9 | 90.61 |

Based on Table 6, the efficiency of the electronic device of a proportion of 20 wt %-40 wt % of amorphous alloy and a proportion of 80 wt %-60 wt % of iron powder can reach above 75% in the frequency of 25 KHz and above 90% in the frequency of 300 KHz. It is clear that the efficiency performance of the electronic device of the present embodiment is excellent.

<Experiment 4>

The structure of an electronic device in Experiment 4 is the same with the structure of the electronic device 300 in FIG. 4. The thread diameter A of the wire 320 is 0.32 mm, the diameter B of the coil is 2.4 mm, the number of turns of the coil is 11.5, and the molding pressure for the magnetic body 310 is 8 or 11t/cm². The major ingredient, mean particle diameter, and hardness of a first magnetic powder and a second magnetic powder in Experiment 4 are all listed in Table 7.

TABLE 7

|  | Major ingredient | Mean particle diameter | Hardness Hv |
|---|---|---|---|
| First magnetic powder | Fe—Cr—Si | 10 μm | 250 |
| Second magnetic powder | iron | 4 μm | 30~80 |

Figure 11A:
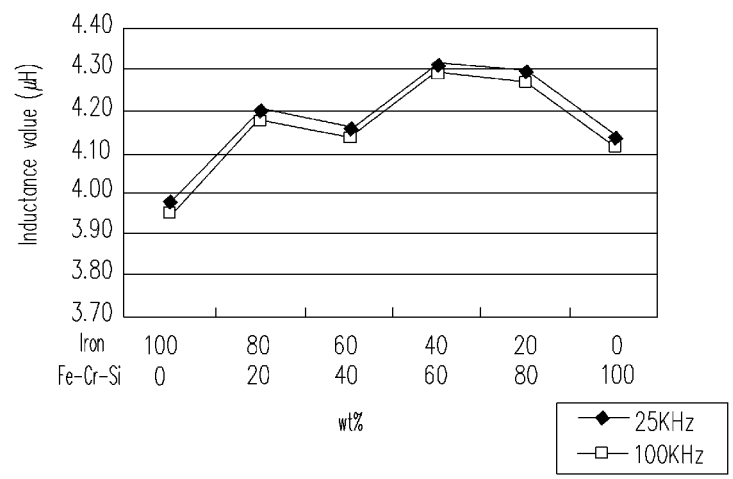
FIG. 11A illustrates variation condition of inductance values of an electronic device when the ratio of a first magnetic powder to a second magnetic powder in the magnetic body changes and also illustrates variation condition of inductance values of the electronic device in two applied frequencies.
Figure 11B:
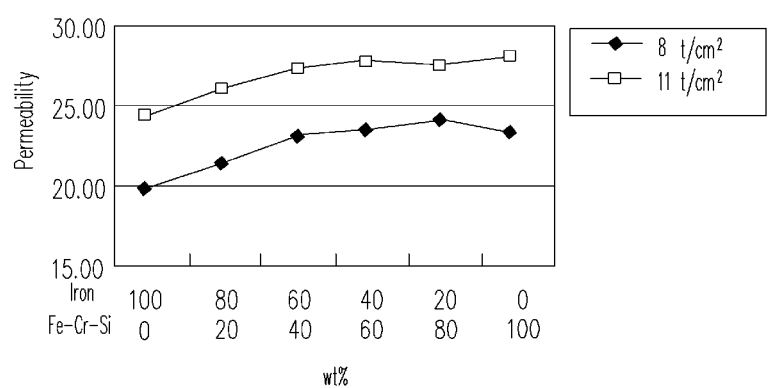
FIG. 11B illustrates variation condition of inductance values of an electronic device when the ratio of a first magnetic powder to a second magnetic powder in the magnetic body changes and also illustrates variation condition of inductance values of the electronic device manufactured by two molding pressures.

Based on Table 7, the ratio of D1 to D2 is 2.5. FIG. 11A illustrates variation condition of inductance values of an electronic device when the ratio of a first magnetic powder to a second magnetic powder in the magnetic body changes and also illustrates variation condition of inductance values of the electronic device in two applied frequencies. FIG. 11B illustrates variation condition of permeability of the electronic device when the ratio of the first magnetic powder to the second magnetic powder in the magnetic body changes and also illustrates variation condition of permeability of the electronic device manufactured by two molding pressures.

Based on FIG. 11A, the inductance values of the electronic device with the proportion of 20 wt %-80 wt % of the first magnetic powder are all greater than the inductance values of an electronic device with the proportion of 100 wt % of the first magnetic powder or the second magnetic powder. Preferably, the proportion of the first magnetic powder is 60 wt % and the proportion of the second magnetic powder is 40 wt %. That is, the ratio of the weight of the first magnetic powder to the weight of the second magnetic powder is 1.5. Or, the proportion of the first magnetic powder is 60 wt %-80 wt % and the proportion of the second magnetic powder is 40 wt %-20 wt %, i.e. the ratio of the weight of the first magnetic powder to the weight of the second magnetic powder is 1.5-4. In addition, based on FIG. 11B, when the molding pressure is higher, the permeability of the electronic device is greater. Therefore, the permeability of the electronic device can be adjusted by the changes of the molding pressure.

<Experiment 5>

The structure of an electronic device in Experiment 5 is the same with the structure of the electronic device 300 in FIG. 4. The thread diameter A of the wire 320 is 0.32 mm, the diameter B of the coil is 2.4 mm, the number of turns of the coil is 11.5, and the molding pressure for the magnetic body 310 is 11t/cm². The major ingredient, mean particle diameter, and hardness of a first magnetic powder and a second magnetic powder in Experiment 5 are all listed in Table 8.

TABLE 8

|  | Major ingredient | Mean particle diameter (D50) | Hardness (Hv) |
|---|---|---|---|
| First magnetic powder | Amorphous alloy | 40 μm | 900~1,000 |
| Second magnetic powder | iron | 4 μm | 30~80 |
| Second magnetic powder | Fe—Cr—Si | 10 μm | 250 |

Figure 12:
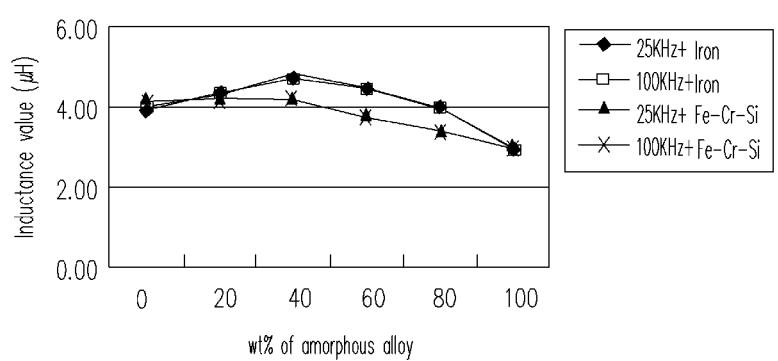
FIG. 12 illustrates variation condition of inductance values of an electronic device in two frequencies when the ratio of a first magnetic powder to a second magnetic powder in a magnetic body changes.

Referring to FIG. 12, the inductance values of the electronic device with the proportion of 20 wt %-80 wt % of the first magnetic powder are all greater than the inductance values of the electronic device with the proportion of 100 wt % of the first magnetic powder or the second magnetic powder when the material of the second magnetic powder is iron and the ratio of D1 to D2 is 10. Preferably, the proportion of the first magnetic powder is 40 wt % and the proportion of the second magnetic powder is 60 wt %. That is, the ratio of the weight of the first magnetic powder to the weight of the second magnetic powder is 0.67. Or, the proportion of the first magnetic powder is 40 wt %-60 wt % and the proportion of the second magnetic powder is 60 wt %-40 wt %, i.e. the ratio of the weight of the first magnetic powder to the weight of the second magnetic powder is 0.67-1.5.

The inductance values of the electronic device with the proportion of 20 wt %-80 wt % of the first magnetic powder are greater than the inductance values of the electronic device with the proportion of 100 wt % of the first magnetic powder and the inductance values of the electronic device with the proportion of 20 wt %-40 wt % of the first magnetic powder are slightly higher than the inductance values of the electronic device with the proportion of 100 wt % of the second magnetic powder when the material of the second magnetic powder is Fe—Cr—Si alloy and the ratio of D1 to D2 is 4. Therefore, in preferred conditions, the proportion of the first magnetic powder is 20 wt %-40 wt % and the proportion of the second magnetic powder is 80 wt %-60 wt %. That is, the ratio of the weight of the first magnetic powder to the weight of the second magnetic powder is 0.25-0.67.

Based on the above, it can be known that the smaller the mean particle diameter of the second magnetic powder is, the better effects of the inductance value of the electronic device will be by means of the second magnetic powder of different mean particle diameters and the same first magnetic powder.

In summary, the present invention at least has the following advantages:

1. The magnetic body is made of magnetic powder of different mean particle diameter in the present invention. Therefore, during the molding process, magnetic powder of small mean particle diameter is filled in the space among magnetic powder of large mean particle diameter such that the density of compression is increased so as to improve the permeability of the electronic device.

2. The magnetic body is made of magnetic powder of different hardness in the present invention and magnetic powder of small mean particle diameter is filled in the space among magnetic powder of large mean particle diameter. Therefore, the molding pressure required in the molding process and the strains of magnetic powder caused during the molding process are largely reduced such that the core loss of the electronic device of the present invention is further decreased. In addition, the present invention can avoid performing a high temperature heat treatment to the electronic device for releasing the strains of the magnetic powder and can avoid the problem of oxidation of the wire for being unable to stand the high temperature.

3. The first magnetic powder and the second magnetic powder are adopted to manufacturing the magnetic body in the present invention. Therefore, compared with prior art, in which iron powder is adopted to manufacture a magnetic body, the permeability and corresponding inductance value of the electronic device of the present invention is higher when in high frequency (25 KHz or 100 KHz).

4. The first magnetic powder of metal alloy powder and the second magnetic powder are adopted in the present invention, and the material cost thereof is lower than that of a magnetic body completely manufactured with metal alloy powder.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
   a first magnetic powder;
   a second magnetic powder, mixed with the first magnetic powder to form a mixture of the first magnetic powder and the second magnetic powder, wherein the mean particle diameter of the first magnetic powder is larger than the mean particle diameter of the second magnetic powder, the hardness of the first magnetic powder is greater than the hardness of the second magnetic powder by a first hardness difference; and
   an insulated conducting wire buried in the mixture of the first magnetic powder and the second magnetic powder, wherein the insulated conducting wire comprises a plurality of winding turns, wherein at least two adjacent winding turns are in contact with each other;
   wherein by means of the first hardness difference of the first magnetic powder and the second magnetic powder, the mixture of the first magnetic powder and the second magnetic powder and the insulated conducting wire buried therein are combined to form an integral magnetic body at a temperature lower than the melting point of the insulated conducting wire.

2. The electronic device according to claim 1, wherein the mean particle diameter of the second magnetic powder is smaller than or equal to 10 μm and wherein a material of the first magnetic powder comprises amorphous alloy and a material of the second magnetic powder comprises iron.

3. The electronic device according to claim 1, wherein the mean particle diameter of the first magnetic powder is substantially 10 μm to 40 μm, wherein a material of the first magnetic powder comprises amorphous alloy, and a material of the second magnetic powder comprises iron.

4. The electronic device according to claim 1, wherein the Vicker's Hardness of the first magnetic powder is greater than or equal to 250, and the Vicker's Hardness of the second magnetic powder is smaller than or equal to 80.

5. The electronic device according to claim 1, wherein the mean particle diameter of the second magnetic powder is smaller than or equal to 4 μm.

6. The electronic device according to claim 1, wherein the ratio of the mean particle diameter of the first magnetic powder to the mean particle diameter of the second magnetic powder is greater than 2.5, and the mean particle diameter of the second magnetic powder is smaller than or equal to 4 μm.

7. The electronic device according to claim 1, wherein the electronic device is an inductor and the efficiency of the inductor is above 90% when the inductor is operating in frequency of 300KHz.

8. An electronic device, comprising:
   a first magnetic powder;
   a second magnetic powder, mixed with the first magnetic powder to form a mixture of the first magnetic powder and the second magnetic powder, wherein the mean particle diameter of the first magnetic powder is larger than the mean particle diameter of the second magnetic powder, the hardness of the first magnetic powder is greater than the hardness of the second magnetic powder by a first hardness difference with a ratio of the hardness of the first magnetic powder to the hardness of the second magnetic powder being greater than 2; and
   an insulated conducting wire buried in the mixture of the first magnetic powder and the second magnetic powder, wherein the insulated conducting wire comprises a plurality of winding turns;
   wherein by means of the first hardness difference of the first magnetic powder and the second magnetic powder, the mixture of the first magnetic powder and the second magnetic powder and the insulated conducting wire buried therein are combined to form an integral magnetic body at a temperature lower than the melting point of the insulated conducting wire.

9. The electronic device according to claim 8, wherein at least two adjacent winding turns of the plurality of winding turns are in contact with each other.

10. The electronic device according to claim 8, wherein the ratio of the hardness of the first magnetic powder to the hardness of the second magnetic powder is greater than 3.

11. The electronic device according to claim 8, wherein a material of the first magnetic powder comprises amorphous alloy and a material of the second magnetic powder comprises iron.

12. The electronic device according to claim 8, wherein the electronic device is an inductor and the efficiency of the inductor is above 90% when the inductor is operating in frequency of 300KHz.

13. An electronic device, comprising:
    a first magnetic powder;
    a second magnetic powder, mixed with the first magnetic powder to form a mixture of the first magnetic powder and the second magnetic powder, wherein the mean particle diameter of the first magnetic powder is larger than the mean particle diameter of the second magnetic powder, and the hardness of the first magnetic powder is greater than the hardness of the second magnetic powder by a first hardness difference with a ratio of the hardness of the first magnetic powder to the hardness of the second magnetic powder being greater than 2; and
    an insulated conducting wire buried in the mixture of the first magnetic powder and the second magnetic powder, wherein the insulated conducting wire comprises a plurality of winding turns;
    wherein the mixture of the first magnetic powder and the second magnetic powder and the insulated conducting wire buried therein are combined to form an integral magnetic body at a temperature lower than 300° C.

14. The electronic device according to claim 13, wherein at least two adjacent winding turns of the plurality of winding turns are in contact with each other.

15. The electronic device according to claim 13, wherein the ratio of the hardness of the first magnetic powder to the hardness of the second magnetic powder is greater than 3.

16. The electronic device according to claim 13, wherein the electronic device is an inductor and the efficiency of the inductor is above 90% when the inductor is operating in frequency of 300KHz.

17. An electronic device, comprising:
    a first magnetic powder;
    a second magnetic powder, mixed with the first magnetic powder to form a mixture of the first magnetic powder and the second magnetic powder, wherein a ratio of the mean particle diameter of the first magnetic powder to the mean particle diameter of the second magnetic powder is greater than 2, and the hardness of the first magnetic powder is greater than the hardness of the second magnetic powder by a first hardness difference with a ratio of the hardness of the first magnetic powder to the hardness of the second magnetic powder being greater than 2; and an insulated conducting wire buried in the mixture of the first magnetic powder and the second magnetic powder, wherein the insulated conducting wire comprises a plurality of winding turns;

wherein the mixture of the first magnetic powder and the second magnetic powder and the insulated conducting wire buried therein are combined to form an integral magnetic body at a temperature lower than 300° C.

18. The electronic device according to claim 17, wherein the ratio of the hardness of the first magnetic powder to the hardness of the second magnetic powder is greater than 3.

19. The electronic device according to claim 17, wherein at least two adjacent winding turns of the plurality of winding turns are in contact with each other.

20. The electronic device according to claim 17, wherein the electronic device is an inductor and the efficiency of the inductor is above 90% when the inductor is operating in frequency of 300KHz.

* * * * *